United States Patent [19]

Morioka et al.

[11] Patent Number: 4,584,174

[45] Date of Patent: Apr. 22, 1986

[54] SINGLE CRYSTAL OF COMPOUND SEMICONDUCTOR OF GROUPS III-V WITH LOW DISLOCATION DENSITY

[75] Inventors: Mikio Morioka; Atsushi Shimizu, both of Hyogo, Japan

[73] Assignee: Sumitomo Electric Industries, Ltd., Osaka, Japan

[21] Appl. No.: 704,027

[22] Filed: Feb. 21, 1985

[30] Foreign Application Priority Data

Feb. 23, 1984 [JP] Japan .................... 59-34560

[51] Int. Cl.$^4$ ............... H01L 29/20; C22C 12/00
[52] U.S. Cl. .................................. 420/555; 148/33; 148/400; 148/404; 428/620
[58] Field of Search ............. 420/555; 148/400, 404, 148/33; 428/620

[56] References Cited

U.S. PATENT DOCUMENTS

| | | | |
|---|---|---|---|
| 2,858,275 | 10/1958 | Folberth | 252/62.3 |
| 3,077,384 | 2/1963 | Euk et al. | 420/555 |
| 3,496,118 | 2/1970 | Willardson et al. | 156/604 |
| 3,932,883 | 1/1976 | Rowland et al. | 148/33 |
| 4,035,205 | 7/1977 | Lebailly et al. | 148/33 |
| 4,213,801 | 7/1980 | Johnston | 148/33 |
| 4,252,576 | 2/1981 | Hasegawa et al. | 148/33 |
| 4,399,097 | 8/1983 | Gallagher et al. | 420/555 |
| 4,404,265 | 9/1983 | Manasevit | 148/33 |

OTHER PUBLICATIONS

"Effect of Doping on Formation of Dislocation Structure in Semiconductor Crystals" Journal of Crystal Growth 52(1981), 391–403, M. G. Mil'Vidsky et al.
"Dislocation–Free GaAs and InP Crystals by Isoelectronic Doping" Journal of Crystal Growth 61(1983), 417–424, G. Jacob et al.

Primary Examiner—Veronica O'Keefe
Attorney, Agent, or Firm—Cushman, Darby and Cushman

[57] ABSTRACT

More than two isoelectronic impurities are doped in a host crystal of compound semiconductors of groups III-V.

An impurity atom forms a covalent bond with a host atom. Although the real bond length "A" between an impurity and a host atom in the crystal cannot be measured, it can be surmised from the bond length "a" between two atoms in a pure two-component crystal consisting of the elements same with the impurity atom and the host atom. The bond length between host atoms in the crystal is called standard bond length "$a_0$". Definite and measurable bond length "a" replaces the real unknown bond length "A". The impurity whose replaced bond length "$a_1$" is shorter than "$a_0$" is called an under-impurity. The impurity whose replaced bond length "$a_2$" is longer than "$a_0$" is called an over-impurity.

In this invention at least one under-impurity and at least one over-impurity are doped in the host single crystal. From the concentrations "$x_1$" and "$x_2$", and the replaced bond lengths "$a_1$" and "$a_2$" of the isoelectronic under- and over-impurities, an arithmetic average "$\bar{a}$" of the bond lengths is calculated. This invention requires that the total concentrations of the isoelectronic impurities should be larger than $10^{18}$ atoms/cm$^3$ and the difference between "$\bar{a}$" and "$a_0$" should be less than plus or minus 2%. Size effects of under- and over-impurities compensate each other in the double-impurity-doped crystal.

7 Claims, 4 Drawing Figures

SINGLE CRYSTAL OF COMPOUND SEMICONDUCTOR OF GROUPS III-V WITH LOW DISLOCATION DENSITY

BACKGROUND OF THE INVENTION (a) Field of the Technology

This invention relates to a single crystal of compound semiconductor of groups III-V with low dislocation density.

The elements of group III on the periodic table are B, Al, Ga, In, etc. The elements of group V are N, P, As, Sb, etc. Semiconductors consisting of these elements are GaAs, InSb, GaP, GaSb and other many compounds.

Compound semiconductors of groups III-V are used as substrate for field effect transistors, integrated circuits including them, light emitting devices, light detecting devices or various optical integrated circuits.

Dislocation density signifies the numbers of dislocation of lattices in a single crystal in unit volume. Dislocation density is frequently represented by EPD (Etch Pit Density). A single crystal is sliced to thin wafers. A wafer is then etched in a pertinent etchant which reveals superficial dislocations as etch pits. EPD is defined as a number of etch pits per unit area. Operator counts the number of etch pits in a definite area on a wafer through a microscope and calculates EPD by dividing the number by the area.

Although EPD is one of practical representations of dislocation density, we give the terms EPD and dislocation density the same meaning from now on.

It is desirable that dislocation density is low, and the distribution of dislocation density is uniform on a wafer. It may be best, that the distribution of dislocation density is uniform throughout a single crystal ingot.

However, for instance, GaAs single crystals grown by conventional LEC method (Liquid Encapsulated Czockralski Method) have great many dislocations, EPD is usually 50,000 to 100,000 $cm^{-2}$.

LEC method is one of pulling methods for crystal growth. A single crystal is pulled up into $B_2O_3$ from a material melt. Temperature gradient in the crystal is very large near a solid-liquid interface. Big thermal stress is generated. Great thermal distortions happen by the stress. Prevailing thermal distortions multiply dislocations in the single crystal.

HB method (Horizontal Bridgman Method) is one of boat methods for crystal growth. It uses a boat containing material melt and grows a single crystal by changing the temperature distribution in a horizontal direction. This method can make a single crystal with a low EPD, because it has so high degree of freedom for controlling temperature distributions that generation of thermal stress is reduced enough.

However a single crystal made by HB method has not a round section. The section resembles the character "D". Much parts of a crystal were wasted in a grinding process to make round wafers.

Besides, because HB method uses a quartz boat, the grown crystal is apt to include silicon. Therefore the crystals grown by HB method has low resistivity in general. To endow semi-insulation which is an indispensable characteristic for FET substrate, we must dope Cr, etc. into a crystal.

This invention has a wide applicability for any methods for growing a single crystal of compound semiconductors. Namely it is fully applicable to LEC method, HB method and other methods.

(b) Impurity Hardening

Most pure metals are soft and weak metals. Hardness and stickiness of metals are heighten by adding impurities. For example, carbon is added to iron to harden it. An alloy is made by mixing different metals.

With regard to compound semiconductors some trials were done to harden crystals and to reduce dislocation density by doping impurities.

In the U.S. Pat. No. 3,496,118 (patented on Feb. 17, 1970), Willardson et al. insisted that impurity doping of Te, Sb, Bi, Pb etc. into a compound semiconductor is effective to heighten electron mobility in the compound semiconductors belonging to groups III-V. Willardson et al. asserted to choose impurities whose distribution coefficient is less than 0.02.

In Journal of Crystal Growth 52 (1981) p. 396–403, Mil'vidsky et al. asserted that they had discovered the fact that EPD was drastically reduced by doping about $10^{19}$ $cm^{-3}$ of Te, In, Sn, etc., when a GaAs single crystal was grown by an LEC method. The best impurity was Te. They reported they had grown a GaAs single crystal of 20 to 25 mm in diameter by doping Te and EPD of the grown crystal was about $10^2$ $cm^{-2}$.

Regarding the ground why impurity-doping reduces EPD, Mil'vidsky et al. explained that impurity-doping raised a critical shear stress in a crystal and high critical shear stress suppressed occurences of dislocations.

In Journal of Crystal Growth 61, (1983) p. 417–424, Jacob et al. reported the results of experiments wherein single crystals of GaAs or InP were grown by an LEC method with impurity doping of P, B, In or Sb. Grown crystals were very small crystals whose diameter is 15 to 25 mm. To dope In, compound InAs was doped into GaAs. To dope Sb, element Sb or compound GaSb was doped into GaAs. According to their experiments, In concentrations in crystal were 7, 11, and $13 \times 10^{19}$ $cm^{-3}$. They wrote concerning former two specimens upper two third of crystals was single-crystallized, and concerning last specimen only upper one fifth of a crystal was single-crystallized. Besides, they reported EPD of the single crystal regions were less than $10^2$ $cm^{-2}$.

In addition Jacob et al. wrote impurity doping of P or B into GaAs crystal never reduced EPD at all.

Several experiments for growing single crystals of GaAs or InP doped with impurities by more than $10^{19}$ $cm^{-3}$ have been done.

They call the phenomenon "impurity hardening". But it is questionable whether this naming is appropriate.

Concerning the questions whey EPD is reduced by the existence of some impurities and why another impurities are totally unable to reduce EPD, any explanations do not satisfy the inventors.

In all the experiments one impurity was doped intentionally. In practice more than one impurities may be included in a single crystal, but these impurities other than one impurity were included in material and were not ridded by a refining process.

There is neither report nor publication concerning a single crystal doped with more than two impurities intentionally.

(c) Isoelectronic Impurity

Because Te, Pb, Si and Cr are not the elements of group III or group V, the electronic property of compound semiconductors of groups III-V is changed by doping with these impurities.

On the contrary doping with the elements of group III, e.g. B, Al, Ga and In or doping with the elements of group V, e.g. N, P, As and Sb does not change the electronic property of compound semiconductors of groups III-V, because doped impurity atoms are apt to replace the lattice sites which should be occupied by elements of a host crystal having the same valence number. To distinguish impurities from main compound elements, the main elements composing the crystal are called "host elements", and the crystal to be doped with impurities is called "host crystal" from now.

These impurities which do not change the electronic property of a host crystal are called "isoelectronic impurities". Practical defnition of isoelectronic impurity is an impurity which is doped into a compound semiconductor of groups III-V and is an element belonging to group III or group V except host elements.

On the contrary the impurities Si, Zn, S, Sn, Te, Cr, Pb, etc., which do not belong to group III nor to group V have electronic activities in compounds of groups III-V. These impurities are called anisoelectronic impurities from now.

(d) Coordination of Lattice Constants

Mixed compound semiconductors are usually made by an epitaxy which forms active layer upon a substrate of compound semiconductor belonging to the same groups. In this case the coordination of lattice constants between the substrate and the epitaxial growth layer is a serious problem.

For example, when an epitaxial growth layer of mixed semiconductor InGaAsP is grown upon an InP substrate, the difference of lattice constants between InP and InGaAsP should be coodinated to be less than 0.2%.

Here InGaAsP is a simplified representation of a mixed semiconductor consisting of In, Ga, As and P. A rigorous representation may be $In_{1-x}Ga_xAs_yP_{1-y}$. The lattice constant varies as a function of component ratios x and y. However the component ratios are omitted for simplification now.

When an epitaxial layer of mixed compound GaAlAs is grown on a GaAs substrate, the allowable maximum difference of lattice constants is 0.26%.

To grow an epitaxial layer upon a substrate, the coordinate of lattice constants between the epitaxial layer and the substrate is decisively important.

The difference of lattice constants would generate misfit dislocations at the boundary between substrate and epitaxial layer. The misfit dislocations would propagate into an epitaxial layer and multiply dislocations in the layer.

Besides epitaxy, coordination of lattice constants is important also for pulling of a single crystal.

For example, when a single crystal of mixed compound InGaSb is grown by a pulling method using a GaSb seed crystal, micro cracks occur in an InGaSb single crystal, if the difference of lattice constants between the GaSb seed crystal and the pulled InGaSb crystal.

Therefore the coordination of lattice constants between two crystal is an absolute requirement, when one crystal succeeds to another crystal whose components differ from the former one at a definite boundary.

(e) Problem of Inclusion Incurred by an Impurity Doping

Jacob's impurity-doped single crystals of compound semiconductors aforementioned had serious difficulties, although EPD were greatly reduced in a confined region of the crystals.

Considerable amount of an impurity must be doped to reduce EPD. As the distribution coefficient of an impurity is either more than 1 or less than 1, the impurity concentration changes to a great extent while a single crystal is pulled upward.

In many cases distribution coefficient is much less than 1. In this case impurity is condensed in a melt while crystal growth progresses. Therefore impurity concentration in a grown crystal is lowest at a front end (which is connected with a seed crystal) and highest at a back end (which is farthest from a seed crystal and is pulled last).

If the impurity concentration in a crystal is high, for example, 10% even at the front end, the pulled crystal cannot become a single crystal at the back end where impurity is concentrated. Near the back end impurity inclusion occurs on the surface of the crystal. Poly-crystal or crystal with impurity inclusion cannot be used as substrate for electronic devices.

Although Jacob pulled up very small crystals which were 15 to 25 mm in diameter, he reported lower one third to two third regions of the crystal were non-single in case of high impurity doping.

Occurence of thermal distortions in a semiconductor crystal is supposed to be in proportion to the second to the third power of diameter.

Wafers must be at least two inches in diameter to be practically used for industrial purposes. Production of such wide wafers is supposed to be several times as difficult as that of small wafers of 15 to 25 mm in diameter.

We think the production of the low EPD single crystal is meaningless in practice, because the single crystal is 20 mm in diameter and the region without dislocation is only upper small part near a seed crystal.

For example in case of In doping to a GaAs host crystal, good amount of doping of In causes localized segregations of In (facet phenomenon, striation or supercooling), which bring about non-uniformity of component ratios in the In-doped GaAs single crystal. At these region lattice misfit occurs.

As In is more condensed, In inclusion occurs and crystal becomes non-single. Such an impurity inclusion near a back end of a crystal also occurs in the case of Sb doping into a GaAs host crystal.

To reduce EPD in a crystal, great amount of impurity must be doped. But if the impurity concentration is high, the crystal becomes poly-crystal and impurity inclusion occurs near a back end of a crystal.

There is no generally-accepted explanation of the impurity inclusion and the beginning of polycrystallization.

The Inventors suppose it is because an effective diameter of an impurity element is larger than that of a host element of the same group which the impurity should replace.

For example we consider the case of In doping into GaAs. If In atom replaces a Ga atom at a Ga site, the bond length of In-As is supposed to be longer than the bond length of Ga-As, because effective diameter of In is larger than that of Ga.

Although it may be a very microscopic change, the size of lattices including an In atom is apt to become bigger than that of other lattices consisting of only host elements. If the amount of doped In is big, the effects of excess sizes of lattices will be so much accumulated that macroscopic lattice misfits occur and destroy the structure of single crystal.

We don't know how long the bond length of In-As in a GaAs single crystal is in practice. Probably the bond length of In-As would vary as a function of the concentration of In. The bond length must differ from the bond length of Ga-As. And the bond length of In-As would differ from the bond length of In-As in an InAs single crystal.

We suppose the bond length of In-As in a GaAs single crystal would take a middle value between the bond length of Ga-As in a GaAs single crystal and the bond length of In-As in an InAs single crystal.

Unlike the impurities In and Sb, the other impurities, B, N, P and Al in a GaAs host crystal have effective radius smaller than that of the host elements. Similar assumption would hold in the case of the smaller impurities.

If we assume an impurity element B in a GaAs crystal replaces a Ga site of a lattice, the bond length of B-As would be shorter than the bond length of Ga-As in the host crystal but longer than the bond length of B-As in a BAs crystal.

(f) Microscopic Lattice Coordination

If the impurity inclusion on the bottom part of GaAs single crystal by doping an impurity In or Sb would be generated from macroscopic excess of lattice constant of an impurity-doped crystal, doping of a smaller impurity B or N would compensate the excess of lattice constant.

Of course an impurity-doped crystal has not distinctive boundaries which might divide the lattices consisting only of host elements from the lattices including impurity elements unlike an epitaxial layer grown on a substrate or a single crystal grown from a seed crystal. Therefore the lattice misfit in an impurity-doped crystal will differ from the lattice misfit in these matters.

However we can imagine small regions with pertinent volumes in an impurity-doped crystal. And we can consider the crystal would be divided into the imaginary small regions. Some imaginary small regions have no impurity. Other imaginary small regions have one impurity. Another imaginary regions have two impurities, and so on.

In an impurity-doped crystal the various kinds of small regions adjoin one another. Lattice coordination would be required on the boundaries also.

If the requirement of lattice coordination was imposed upon the boundaries between imaginary small regions, the requirement would be satisfied by doping two kinds of impurities in a host crystal. For example host elements are Ga and As in the case of a GaAs single crystal. From now we call the impurities which are apt to make a bond longer than the host bond of Ga-As by coupling with one of host elements "over-impurities". And we call the impurities which are apt to make a bond shorter than the host bond of Ga-As by coupling with one of host elements "under-impurities".

For example, with regard to a GaAs host crystal, B and N are under-impurities. Sb and In are over-impurities.

In the case of an InAs host crystal, B, N, Ga, P and Al are under-impurities. Sb is an over-impurity.

We assume the impurities would be replaced on the corresponding lattice sites in a crystal.

The bond length between host elements is denoted by $A_0$. The bond length between an under-impurity and a host element is denoted by $A_1$. The bond length between an over-impurity and a host element is denoted by $A_2$.

For example when N and In are doped as impurities into a GaAs crystal, $A_0$ is a bond length of Ga-As, $A_1$ is a bond length of N-Ga and $A_2$ is a bond length of In-As.

We consider the change of the length of a side of an imaginary small region. In a small region, we define that $N_0$ is a number of host pairs Ga-As, $N_1$ is a number of under-impurity atoms, $N_2$ is a number of over-impurity atoms, $u_1$ is a quotient of $N_1$ divided by $N_0$, and $u_2$ is a quotient of $N_2$ divided by $N_0$.

The length "l" of a side of a small region is given by $$l = (1 - u_1 - u_2) + \frac{A_1}{A_0} u_1 + \frac{A_2}{A_0} u_2 \tag{1}$$

where l is normalized to be a unit when no impurity exists.

Deviations $\eta_1$ and $\eta_2$ of the bond lengths $A_1$ and $A_2$ from the standard bond length $A_0$ are defined by, $$\eta_1 = (A_1 - A_0)/A_0 \tag{2}$$

$$\eta_2 = (A_2 - A_0)/A_0 \tag{3}$$

The deviation $\eta_1$ is negative, but the deviation $\eta_2$ is positive.

The misfit $\epsilon$ of lattice constants is defined by $$\epsilon = l - 1 \tag{4}$$

Then we obtain, $$\epsilon = \eta_1 u_1 + \eta_2 u_2 \tag{5}$$

As mentioned before, the maximum value of allowable misfit of lattice constants between a substrate and an epitaxial layer or between a seed crystal and a single crystal grown therefrom is about 0.2%. Such contacts are one-dimensional contacts.

However in the case of an impurity-doped single crystal, a small region having impurity atoms contacts with six small regions without impurity atom on up and down, right and left, front and rear boundaries. This is a three-dimensional contact.

Accordingly the requirement of lattice coordination should be far more rigorous. We suppose the requirement of lattice coordination may be the order of 0.01%.

From the definition of $u_1$ and $u_2$, $$u_1 N_0 = N_1 \tag{6}$$

$$u_2 N_0 = N_2 \tag{7}$$

Now $N_0$ will be eliminated together with $N_1$ and $N_2$. Instead of these variables we use the ratios $Z_1$ and $Z_2$ of under-impurity and over-impurity to total impurities. The definitions of $Z_1$ and $Z_2$ are, $$Z_1 + Z_2 = 1 \tag{8}$$

$$Z_1 = u_1 N_0/(N_1 + N_2) \tag{9}$$

$$Z_2 = u_2 N_0/(N_1 + N_2) \tag{10}$$

The ratio of $Z_1$ to $u_1$ or $Z_2$ to $u_2$ is equal to be a ratio of the number of host atoms to the number of impurity atoms. The ratio is supposed to be about 100 to 10,000.

If the lattice misfit ε defined by Eq.(5) should be smaller than 1/100%, lattice misfit coefficient δ defined by $Z_1$ and $Z_2$ instead of Eq.(5)

$$\delta = \eta_1 Z_1 + \eta_2 Z_2 \qquad (11)$$

should be smaller than a maximum value which may be 1% to 10%.

$Z_1$ and $Z_2$ in Eq.(11) are ratios. The lattice misfit coefficient δ can be defined by impurity concentrations $x_1$ and $x_2$ (atoms/cm$^3$). Then, $$\delta = \frac{\eta_1 x_1 + \eta_2 x_2}{x_1 + x_2} \qquad (12)$$

where $x_1$ is a concentration of an under-impurity, and $x_2$ is a concentration of an over-impurity.

Eq.(12) is equivalent to Eq.(11).

If more than one kind of under-impurities or more than one kind of over-impurities exist in a crystal, summations with regard to the impurities will give us a modified expression of the lattice misfit coefficient δ

$$\delta = \frac{\Sigma \eta_1 x_1 + \Sigma \eta_2 x_2}{\Sigma x_1 + \Sigma x_2} \qquad (13)$$

instead of Eq.(12). Here the simbol Σ in front of $x_1$ signifies to sum up the variables with regard to all under-impurities. The simbol Σ in front of $x_2$ signifies to sum up the variables with regard to all over-impurities.

We call Eq.(11), Eq.(12) and Eq.(13) lattice misfit coefficient equations.

In this invention we suggest to compose impurities to keep the absolute value of the lattice misfit coefficient smaller than 2%.

Another expression of lattice misfit coefficient δ is obtained from Eq.(2), Eq.(3) and Eq.(11). Then, $$\delta = (A_1 Z_1 + A_2 Z_2 - A_0)/A_0 \qquad (14)$$

Similarly from Eq.(2), Eq.(3) and Eq.(13), fourth expression of δ is obtained as $$\delta = \left( \frac{\Sigma A_1 x_1 + \Sigma A_2 x_2}{\Sigma x_1 + \Sigma x_2} - A_0 \right) / A_0 \qquad (15)$$

The arithmetic average of bond lengths of impurity-host bonds is denoted by $\overline{A}$. $\overline{A}$ is written by $$\overline{A} = A_1 Z_1 + A_2 Z_2 \qquad (16)$$

Otherwise, $$\overline{A} = \frac{\Sigma A_1 x_1 + \Sigma A_2 x_2}{\Sigma x_1 + \Sigma x_2} \qquad (17)$$

From Eq.(14) and Eq.(16) or from Eq.(15) and Eq.(17), δ is simply given by $$\delta = (\overline{A} - A_0)/A_0 \qquad (18)$$

From Eq.(18), the lattice misfit coefficient δ is a quotient of the difference between the arithmetic average of impurity-bond lengths and the standard bond length divided by the standard bond length.

(g) Surmise of Bond Lengths

The bond lengths $A_0$, $A_1$ and $A_2$ are the variables depending upon the impurity concentrations. We safely assume the standard bond length $A_0$ between host elements is equal to the normal standard bond length between host elements in a host crystal without impurity.

However $A_1$ and $A_2$ cannot easily be surmised.

Then we replace the bond lengths $A_1$ and $A_2$ by more definite and measurable bond lengths $a_1$ and $a_2$, which are defined as bond lengths between an impurity atom and a host atom in a pure single crystal of groups III-V comprising only the elements same with the impurity element and the host element to be coupled with it.

The bond lengths $a_1$ and $a_2$ are definite and known in many cases. But $a_1$ and $a_2$ are not equal to $A_1$ and $A_2$. Pure bond lengths $a_1$ and $a_2$ will be now explained. For example, the bond length of Ga-As in a GaAs single crystal is 2.44 Å. The bond length of In-As in an InAs single crystal is 2.62 Å.

In this case, the impurity bond length $A_2$ of In-As in a GaAs host crystal shall be replaced by the pure bond length $a_2$ (2.62 Å) of In-As in an InAs crystal.

By these replacements, we can calculate the lattice misfit coefficient δ defined by Eq.(14)-Eq.(18).

The bond length of Ga-As in a GaAs crystal is 2.44 Å. The bond length of In-P in an InP crystal is 2.54 Å. The bond length of In-As in an InAs crystal is 2.62 Å. The bond length of Ga-P in a GaP crysal is 2.36 Å.

Similarly we designate 1.95 Å to a Ga-N bond, 2.07 Å to a B-As bond, 2.63 Å to a Ga-Sb bond, and 2.8 Å to an In-Sb bond.

These are the bond lengths concerning isoelectronic impurities. But with regard to anisoelectronic impurities, e.g. Si, Zn, Cr, Sn or S, the bond lengths between an impurity atom and a host atom can be surmised in the same way.

To distinguish the electronic property of impurities, we signify the bond length between an isoelectronic impurity and a host atom by "a", and the bond length between an anisoelectronic impurity and a host atom by "b".

In any case "a" and "b" are not the real bond lengths in an impurity-doped crystal but the definite tetrahedral bond lengths in a pure two-component crystal consisting of the host element and the impurity element.

For both "a" and "b", the lengths shorter than the standard length $a_0$ will be suffixed with "1", and the lengths longer than the standard length $a_0$ will be suffixed with "2".

Table (1) shows the bond lengths in Å unit between the elements of groups III and V in a pure two-component crystal of groups III-V. The elements of group III are denoted in the uppermost line. The elements of group V are denoted in the leftest column. The numeral on a cross point of a column and a line shows the bond length between two atoms of groups III and V which are captioned in the line and the column.

TABLE (1)

| | Bond Lengths in pure crystals of groups III-V (Å unit) | | | |
|---|---|---|---|---|
| | B | Al | Ga | In |
| N | — | — | 1.95 | 2.15 |
| P | 1.96 | 2.36 | 2.36 | 2.54 |
| As | 2.07 | — | 2.44 | 2.62 |
| Sb | — | — | 2.63 | 2.8 |

Instead of Eq.(17), by the replacements of "A" by "a", the arithmetic average "ā" of bond lengths between isoelectronic impurities and host atoms are defined by $$\bar{a} = \frac{\Sigma a_1 x_1 + \Sigma a_2 x_2}{\Sigma x_1 + \Sigma x_2} \quad (19)$$

where "$a_1$" is a bond length between an isoelectronic under-impurity and a host atom, "$a_2$" is a bond length between an iso-electronic over-impurity. Both "$a_1$" and "$a_2$" are given by Table (1).

By using the impurity ratio "Z" instead of the concentrations "x", we obtain another equivalent expression of "ā"

$$\bar{a} = \Sigma a_1 Z_1 + \Sigma a_2 Z_2 \quad (20)$$

instead of Eq.(16).

Instead of Eq.(15), the lattice misfit coefficient δ is calculated by $$\delta = \left( \frac{\Sigma a_1 x_1 + \Sigma a_2 x_2}{\Sigma x_1 + \Sigma x_2} - a_0 \right) / a_0 \quad (21)$$

SUMMARY OF THE INVENTION

This invention requires that the total concentrations of isoelectronic impurities should be more than $10^{18}$ atoms/cm$^3$, and the arithmetic average "ā" of the bond lengths between isoelectronic impurities and host atoms should not differ from the standard bond length "$a_0$" between host atoms by more than plus or minus 2%.

Thus the lattice misfit coefficient δ should satisfy the inequality $$-0.02 \leq \delta \leq 0.02 \quad (22)$$

Instead of Eq.(2) and Eq.(3), the deviations $\eta_1$ and $\eta_2$ are defined by $$\eta_1 = (a_1 - a_0)/a_0 \quad (23)$$

$$\eta_2 = (a_2 - a_0)/a_0 \quad (24)$$

$\eta_1$ is negative. $\eta_2$ is positive. By using these values $\eta_1$ and $\eta_2$, δ can be calculated by Eq.(11), Eq.(12), or Eq.(13).

From Table (1), we can designate definite values to the standard bond length "$a_0$", the shorter bond length "$a_1$" by an under-impurity and the longer bond length "$a_2$" by an over-impurity in a double-impurity-doped single crystal.

Table (2) shows the tetrahedral covalent bond length "$a_0$", "$a_1$" and "$a_2$" in Å unit, and the deviations $\eta_1$ (negative) or $\eta_2$ (positive) by percentage with regard to host crystal and impurities doped therein.

TABLE (2)

| Host Crystal | Isoelectronic Impurity | Tetrahedral Bond | Bond Length (Å) | $\eta_1, \eta_2$ (%) |
|---|---|---|---|---|
| GaAs | — | Ga—As | $a_0 = 2.44$ | — |
| | N | Ga—N | $a_1 = 1.95$ | −20.1 |
| | B | B—As | $a_1 = 2.07$ | −15.2 |
| | P | Ga—P | $a_1 = 2.36$ | −3.3 |

TABLE (2)-continued

| Host Crystal | Isoelectronic Impurity | Tetrahedral Bond | Bond Length (Å) | $\eta_1, \eta_2$ (%) |
|---|---|---|---|---|
| | In | In—As | $a_2 = 2.62$ | +7.4 |
| | Sb | Ga—Sb | $a_2 = 2.63$ | +7.8 |
| InP | — | In—P | $a_0 = 2.54$ | — |
| | B | B—P | $a_1 = 1.96$ | −22.8 |
| | N | In—N | $a_1 = 2.15$ | −15.4 |
| | Al | Al—P | $a_1 = 2.36$ | −7.1 |
| | Ga | Ga—P | $a_1 = 2.36$ | −7.1 |
| | As | In—As | $a_2 = 2.62$ | +3.1 |
| | Sb | In—Sb | $a_2 = 2.80$ | +10.2 |
| InAs | — | In—As | $a_0 = 2.62$ | — |
| | Ga | Ga—As | $a_1 = 2.44$ | −6.9 |
| | P | In—P | $a_1 = 2.54$ | −3.1 |
| | Sb | In—Sb | $a_2 = 2.80$ | +6.9 |
| GaP | — | Ga—P | $a_0 = 2.36$ | — |
| | B | B—P | $a_1 = 1.96$ | −16.9 |
| | As | Ga—As | $a_2 = 2.44$ | +3.4 |
| | In | In—P | $a_2 = 2.54$ | +7.6 |
| | Sb | Ga—Sb | $a_2 = 2.63$ | +11.4 |

As mentioned before, this invention proposes a single crystal of compound semiconductor of groups III–V doped with isoelectronic under- and over-impurities, wherein the total concentrations of isoelectronic impurities are more than $1 \times 10^{18}$ atoms/cm$^3$ and the arithmetic average "ā" of the bond lengths between isoelectronic impurities and host atoms differs from the standard bond length "$a_0$" between host atoms by less than plus or minus two percents.

From Table (2), any deviations $\eta_1$ or $\eta_2$ of the bond lengths of isoelectronic impurities are more than three percents in absolute values. Therefore any single-impurity-doping cannot reduce the difference between "ā" and "$a_0$" to less than three percents.

In this invention at least one isoelectronic over-impurity ($a_2 > a_0$, $\eta_2 > 0$) and least one isoelectronic under-impurity ($a_1 < a_0$, $\eta_1 < 0$) should be doped in a single crystal in order to confine the difference between the arithmetic average "ā" and the standard length "$a_0$" within plus or minus two percents.

In other words this invention requires the absolute value of the lattice misfit coefficient δ should be reduced less than 2% by double doping of isoelectronic under- and over-impurities.

The ground why the concentration of isoelectronic impurities should be bigger than $10^{18}$ atoms/cm$^3$ is that the concentration is a lower limit enough to reduce EPD in a doped single crystal.

Even if δ is 2%, a lattice misfit of 2% does not appear in real crystal lattices.

The lattice misfit coefficient "δ" or the arithmetic average "ā" of bond lengths does not correspond to any concrete physical values.

As mentioned before, when a crystal was imagined to be divided into many small regions, lattice misfits would appear on the boundaries of neighboring regions. But the imaginary lattice misfits are signified by "ε" defined by Eq.(1) and Eq.(2) or Eq.(5).

The lattice misfit coefficient "δ" is the quotient of the product of "ε" and impurity concentration ($N_1 + N_2$) divided by host atom number $N_0$.

Therefore even if "δ" was kept to be constant, the lattice misfit coefficient ε would increase when the impurity concentration was raised. However because "δ" should be confined within plus or minus 2% according to this invention, the imaginary lattice misfit "ε" does not increase so much.

Furthermore it is best to converge "δ" to zero, when the impurity concentration is large.

DETAILED DESCRIPTION OF EMBODIMENTS

Figure 1:
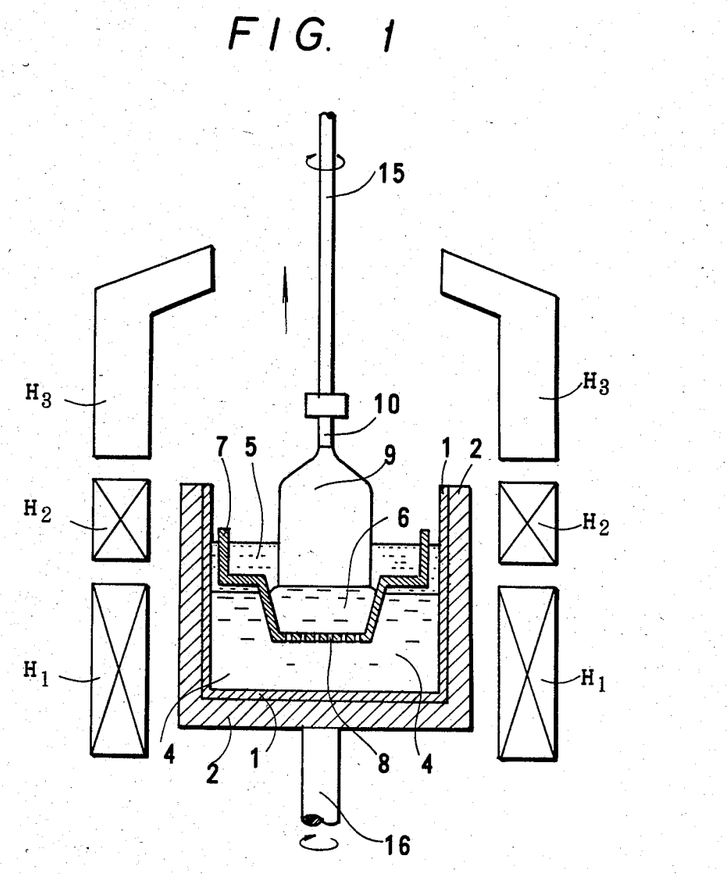
FIG. 1 is a vertically-sectioned view of a liquid encapsulated Czockralski apparatus for growing a single crystal of double crucible type having a floating crucible.

This invention is equally applicable to LEC method and HB method. FIG. 1 shows a three-temperature LEC apparatus for growing a single crystal as an example.

A crucible (1) made from some pertinent material, e.g. PBN (pyrolitic boron nitride) is sustained by a graphite susceptor (2). Material melt contains host compounds and impurities. Then we call it compound melt. The compound melt is divided in two parts by a floating crucible (7).

Then to distinguish the compound melt we call the melt in the floating crucible (7) an inner melt (6) and the melt out of the floating crucible (7) an outer melt (7), if necessary.

The floating crucible (7) has small holes (8) on the bottom wall. The outer melt (4) goes through the small holes (8) into the inner melt (6).

A liquid encapsulant (5) covers both inner melt (6) and outer melts (4).

A seed crystal (10) is fixed at the bottom end of an upper shaft (15). A single crystal (9) is pulled up by the seed crystal (10) in succession. A lower shaft (16) supports the susceptor (2).

Heating apparatus consists of three heaters arranged in a vertical direction. A lower heater (H1), a middle heater (H2) and an upper heater (H3) can be controlled independently.

An LEC method using a floating crucible was proposed by Japanese Patent Laying Open No. 104796/81 filed by the Assignee for the first time. In the improved method the impurity with a distribution coefficient less than 1 should be added in the floating crucible and the impurity with a distribution coefficient more than 1 should be added out of the floating crucible. Then when the compound melt was reduced in the progress of crystal growth, the impurity concentration in the floating crucible hardly changes.

The three-temperature LEC method was a novel method which was disclosed for the first time in Japanese Patent Application No. 154771/83 filed by the Assignee of this invention also. By the improved method, the temperature gradient in a liquid encapsulant $B_2O_3$ can be 30° to 50° C./cm and the temperature gradient in an upper space can be lower than 20° C./cm in the case of the crystal growth of GaAs.

Thus the apparatus shown in FIG. 1 is a very exquisite LEC apparatus.

However this invention can be applied to conventional LEC methods as well as to HB methods. The apparatus of FIG. 1 is only an example of LEC apparatuses.

(a) EMBODIMENT I (InP; Ga, As, S)

An InP single crystal is grown by the LEC apparatus shown in FIG. 1. The InP host crystal is doped with an isoelectronic under-impurity Ga, an isoelectronic over-impurity As and an anisoelectronic impurity S. The liquid encapsulant is fully-dehydrated $B_2O_3$. A floating crucible and an outer crucible are used.

The InP single crystal is grown along $<100>$ direction.

| Materials are; | |
|---|---|
| InP polycrystal $W_0$ | 1000 g (6.859 mol) |
| in floating crucible w | 150 g (1.029 mol) |
| out of floating crucible W | 850 g (5.830 mol) |
| $B_2O_3$ (fully-dehydrated) | 150 g (liquid encapsulant) |
| Impurities are; | |
| GaAs (out of floating crucible) (weight of Ga therein 136 mg) | 283 mg |
| InAs (in floating crucible) (weight of As therein 438 mg) | 1109 mg |
| InS (in floating crucible) (weight of S therein 6.64 mg) | 32 mg |

The distribution coefficients k of A, Ga and S in InP melt and solid are;

k (As) = 0.4
k (Ga) = 3
k (S) = 0.5

Ga is added out of the floating crucible, because the distribution coefficient is more than 1.

An InP single crystal is grown up from the materials by the improved LEC method. The conditions of crystal growth are;

crucible: quartz
temperature of melt: 1100° C.
pressure of nitrogen gas: 49 atm
growing speed: 7 mm/Hr
rotation of upper shaft: 3 to 20 RPM
rotation of lower shaft: 5 to 30 RPM We denote the density of InP by $\rho$ (4.787 g/cm$^3$), and the charged amount of InP polycrystal by w (or W). The volume of the charged InP is $w/\rho$ ($W/\rho$).

"m" is the doping weight of impurity. "M" is the atomic weight of impurity. Then the impurity is doped by (m/M) mol. The number of atoms in 1 mol is equal to the Avogadro's number "$L_0$ (6.02 × 10$^{23}$ atoms)".

"k" denotes the distribution coefficient of the impurity. "m" g of impurity is added into "w" g of charged polycrystal. Then the materials are heated and molten.

"m/M" mol of impurity is contained in the volume ($w/\rho$). Then ($m\rho/Mw$) mol of impurity exists in a unit volume. Impurity density is obtained by multiplying the value by $L_0$. This is the concentration in a melt. The impurity density is obtained by multiplying the product by k.

The impurity concentration "n" in a crystal is $$n = \frac{k \, m \, \rho \, L_0}{M \, W} \quad (25)$$

Substituting $k=0.4$, $m=438$ mg, $M=74.922$, $\rho=4.787$ g/cm$^3$, $L_0=6.02\times10^{23}$ and $W=150$ g (in the floating crucible) into Eq.(25), we obtain the concentration of As, $$n(\text{As})=4.5\times10^{19}\text{ cm}^{-3}$$

This is an initial concentration of As. In the case of conventional LEC methods, the concentration would be rising according to the progress of growth, because k is less than 1. However if a floating crucible is used and the impurity is added only in the floating crucible, the impurity concentration scarcely changes. Rather it slightly decreases.

Substituting $k=3$, $m=136$ mg, $M=69.72$, $\rho=4.787$ g/cm$^3$ and $W=850$ g (Ga is added out of the floating crucible) into Eq.(25), we obtain the impurity concentration of Ga $$n(\text{Ga})=2\times10^{19}\text{ cm}^{-3}$$

It scarcely changes also when double crucibles are used, and Ga is added out of the floating crucible.

Substituting $k=0.5$, $m=6.64$ mg, $M=32$, $\rho=4.787$ g/cm$^3$ and $w=150$ g (S is added into the floating crucible) into Eq.(25), we obtain $$n(\text{S})=2\times10^{18}\text{ cm}^{-3}$$

From the material melt a single crystal of two inches in diameter was grown. It weighed 900 g. The single crystal ingot was sliced into wafers. The wafers were etched by a pertinent etchant. EPD on the wafers was counted. On the periphery of wafers, EPD is very large. EPD was averaged on the surface of a wafer except its periphery with 5 mm width.

average EPD at front end = 4000 cm$^{-2}$
average EPD at back end = 1500 cm$^{-2}$ EPD is usually smaller at front end and bigger at back end in the crystals grown by conventional LEC method.

This result shows an inverse tendency. The important facts are that the crystal of this invention is a single crystal even at the back end and no impurity inclusion happens.

We suppose it may because the As concentration in the floating crucible is diluting during the crystal growth and the As concentration is reduced to an optimum concentration near the back end of the crystal.

The arithmetic average "$\bar{a}$" of bond lengths between isoelectronic impurities and corresponding host atoms are now calculated.

(i) over-impurity
In-As: $a_2 = 2.62$ Å
$n(\text{As})$: $x_2 = 4.5\times10^{19}$ cm$^{-3}$
(ii) under-impurity
Ga-P: $a_1 = 2.36$ Å
$n(\text{Ga})$: $x_1 = 2\times10^{19}$ cm$^{-1}$
From these values, $$\bar{a} = 2.54 \text{ Å}$$

This result coincides with the standard bond length $a_0 = 2.54$ Å of In-P in the host crystal.

This calculation is based upon the calculated initial concentrations of Ga and As.

We measured the concentrations of Ga and As at many parts of a crystal grown by the LEC method, and calculated the arithmetic averages "$\bar{a}$" and the deviations $\delta$ at the sampling parts.

We found the deviations $\delta$ always satisfy the inequality $$-0.5\% < \delta(=(\bar{a} - a_0)/a_0) < +0.8\%$$

Thus the absolute value of $\delta$ was less than 1%.

In this case using double crucibles, the impurity concentrations in the melt are nearly constant during the crystal growth.

However in a conventional LEC method the impurity concentration changes during the crystal growth as long as the distribution coefficient k is not 1.

Even in such a case we can calculate the impurity concentration in a crystal by replacing k in Eq.(25) by $$\frac{k}{(1 - S)^{1-k}}$$

where S is a solidification rate which is defined as a quotient of the weight of solidified (crystallized) part divided by the initial weight of melt.

(b) EMBODIMENT II (InP; Ga, As, Sn)

An InP single crystal is grown by the LEC apparatus shown In FIG. 1. The InP host crystal is doped with an under-impurity Ga, over-impurity As and anisoelectronic impurity Sn.

The growing conditions and the material are similar to the former example except the replacement of S by Sn. The growing direction is <100>.

| Materials are; | |
|---|---|
| InP polycrystal | 1000 g |
| in floating crucible | 150 g |
| out of floating crucible | 850 g |
| B$_2$O$_3$ (fully-dehydrated) | 150 g |
| GaAs (out of floating crucible) | 283 mg |
| InAs (in floating crucible) | 1109 mg |
| Sn (in floating crucible) | 562 mg |

The concentrations of Ga and As are the same with that of the Embodiment I.

With respect to Sn, the distribution coefficient k is 0.022 and the atomic weight M is 118.69. Hence the Sn concentration is $$n(\text{Sn})=2\times10^{18}\text{ cm}^{-3}$$

The arithmetic average length "$\bar{a}$" of bonds In-As ($a_2$) and Ga-P ($a_1$) between isoelectronic impurities and host atoms are $$\bar{a} = 2.54 \text{ Å}$$

This value also coincides with the standard bond length $a_0 = 2.54$ Å in the InP crystal.

We measured the impurity concentrations of Ga and As at many part of the grown single crystal ingot and calculated the deviations $\delta$. All deviations satisfied the inequality $-0.5\% < \delta < +0.7\%$ EPD on many wafers sliced from the ingot were counted. The average values of EPD except the peripheries with 5 mm width were, average EPD (at front end)=5500 cm$^{-2}$
average EPD (at back end)=2500 cm$^{-2}$ EPD is very low in the crystal of the invention. Furthermore EPD is smaller at the back end. No impurity inclusion happens throughout the crystal.

The lengths of the tetrahedral covalent bond in two-component crystal are 2.48 Å for In-S and 2.50 Å for Sn-P. These bond lengths are nearly equal to the standard bond length (2.54 Å) of the InP host crystal. Therefore S and Sn are most favourable third-dopants for InP.

In the examples InP is grown along <100> direction. However this invention is applicable to the InP grown along <111> direction, <311> direction or another direction.

(c) EMBODIMENT III (InP; Ga, As, Fe)

We make an InP crystal doped with Ga, As and Fe by the LEC method. The measured concentration of Fe in the grown crystal is $n(Fe) = 8 \times 10^{15}$ to $8 \times 10^{16}$ cm$^{-3}$ The specific resistivity is 2 to $6 \times 10^7 \Omega$cm. This is a semi-imsulating semi-conductor.

(d) EMBODIMENT IV (GaAs; In, B)

A GaAs single crystal is grown along <100> direction by the LEC apparatus shown in FIG. 1. Isoelectronic over-impurity In and under-impurity B are doped.

| Materials are; | |
|---|---|
| GaAs polycrystal | |
| in floating crucible w | 2000 g (13.83 mol) |
| | 200 g (1.383 mol) |
| out of floating crucible W | 1800 g |
| B$_2$O$_3$ (fully-dehydrated) | 300 g (liquid encapsulant) |
| Isoelectronic impurities are; | |
| In (over-, in floating crucible) | 791 mg |
| B (under-, out of floating crucible) | 123 mg |
| The conditions of crystal growth are; | |
| Temperature of melt | 1250° C. |
| Pressure of nitrogen gas | 8 atm |
| Growing speed | 4 to 10 mm/H |
| Rotations of upper and lower shafts | 3 to 15 RPM |

We assume the distribution coefficient k of In is 0.1.

However the distribution coefficient of B cannot be defined. The concentration of B in melt is not proportional to the concentration of B in solid part.

Figure 2:
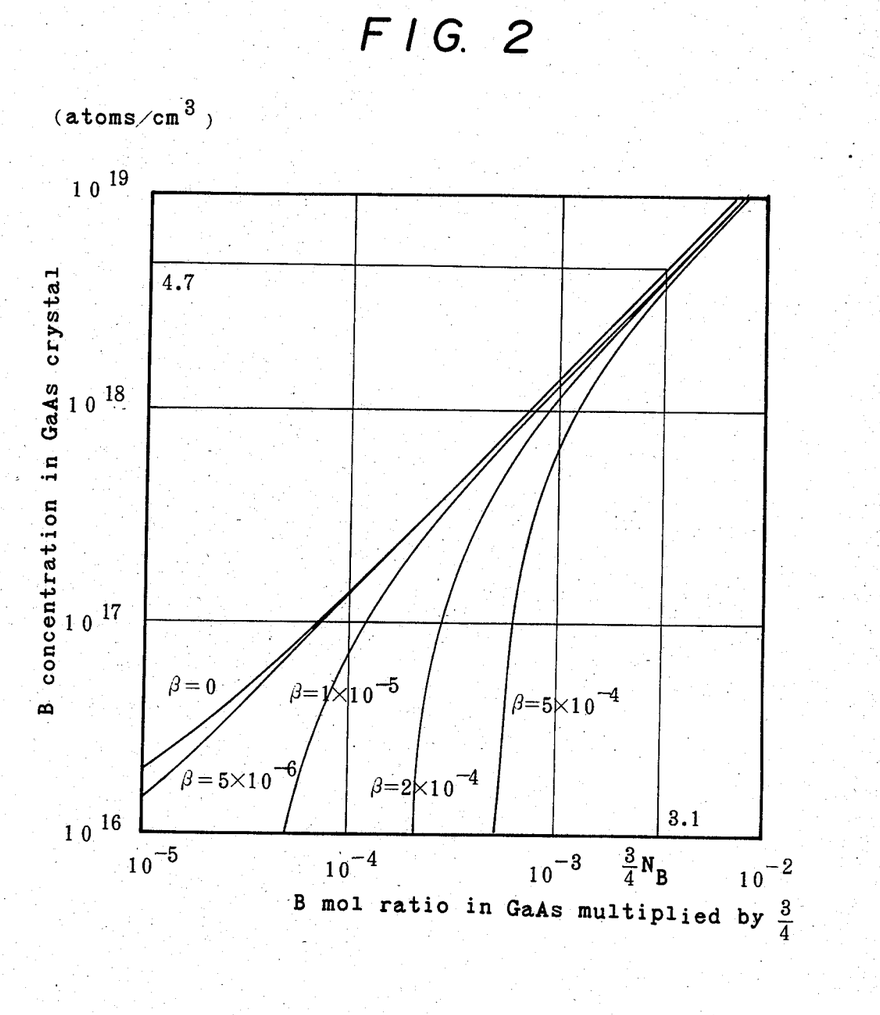
FIG. 2 is a graph showing the relation between the mol ratio of B in melt and the B concentration in a GaAs crystal grown from the melt covered by $B_2O_3$. Parameters $\beta$ show the mol ratios of $O_2$ in $B_2O_3$.

The relationships between the B concentration in melt and the B concentration in solid are changed according to the mol ratio $\beta$ of residual oxygen O$_2$ of water (H$_2$O) included in the liquid encapsulant B$_2$O$_3$ as shown in FIG. 2.

However the distribution coefficients of In and B are safely assumed to be less than 1. Then both In and B are added into the floating crucible.

The concentration n(In) of In will be calculated by Eq.(25). Substituting k=0.1, m=791 mg, $\rho$ (density of GaAs)=5.307 g/cm$^3$, M=114.82, w (infloating crucible)=200 g, we obtain $n(In) = 1.1 \times 10^{19}$ cm$^{-3}$ The concentration of B is calculated from FIG. 2. The abscissa is the mol ratio $M_B$ of B. The ordinate is the concentration of B in solid multiplied by $\frac{3}{4}$. The parameter $\beta$ is the mol ratio of O$_2$ in B$_2$O$_3$. Because B$_2$O$_3$ is fully dehydrated, we can safely assume $\beta=0$.

B is added into the floating crucible. 200 g of GaAs is 13.83 mol. A GaAs molecule consists of two atoms. Total number of mol is twice as much as the former value. Because the atomic weight of B is 10.81, if 123 mg of B is doped into 200 g of GaAs, the mol ratio of B is $4.11 \times 10^{-3}$. Multiplying it by ($\frac{3}{4}$), we obtain $3.1 \times 10^{-3}$ for the abscissa variable ($3N_B/4$). From FIG. 2 the B concentration in crystal is $n(B) = 4.7 \times 10^{18}$ cm$^{-3}$ Arithmetic average of bond lengths will be now calculated.

(i) under
B-As: $a_1 = 2.07$ Å
n(B): $x_1 = 4.7 \times 10^{18}$ cm$^{-3}$
(ii) over
In-As: $a_2 = 2.62$ Å
n(In): $x_2 = 1.1 \times 10^{19}$ cm$^{-1}$
Then the arithmetic average "$\bar{a}$" is $\bar{a} = 2.455$ Å

This is slightly longer than the standard bond length $a_0$ (=2.44) in the GaAs host crystal only by 0.6%.

The impurity concentrations of In and B are measured throughout the single crystal ingot. They were $n(In) = 1.0$ to $1.5 \times 10^{19}$ cm$^{-3}$ $n(B) = 4.5$ to $6 \times 10^{18}$ cm$^{-3}$ The lattice misfit coefficients were calculated at many sampling points from the measure impurity concentrations.

The results were signified by $$-1\% < \delta = \frac{\bar{a} - a_0}{a_0} < +1.3\%$$

The crystal ingot was two inches in diameter. The weight was 1.5 kg. The crystal grown was a single crystal throughout. Specific resistivity was 5 to $10 \times 10^7$ $\Omega$cm. It means the crystal is semi-imsulating semiconductor.

The ingot was sliced into many thin wafers. Wafers were etched. EPDs on wafers were counted. Except the peripheries with 5 mm width, we obtained the average EPD average EPD at front end = 800 cm$^{-2}$
average EPD at back end = 1300 cm$^{-2}$ EPD was very low. Especially it was a surprising result that EPD was so much low at the back end. We obtained a single crystal of very low dislocation density.

Because B has small specific weight and is apt to float on a melt, doping of B is rather difficult. Skillful processes for adding B into material are;

(a) evaporation-coating necessary amount of B at the end of seed crystal and melting B with the end of the seed, (b) evaporation-coating necessary amount of B on the surfaces of host polycrystal in the floating crucible, or (c) evaporation-coating B on the inner surface of the floating crucible.

(e) EMBODIMENT V (GaAs; In, B, Si)

Under the conditions same with the last example, a GaAs crystal doped with In, B and Si is grown along <100> direction by the LEC method.

The charged amounts of GaAs polycrystal, $B_2O_3$, In and B are totally same with the last example. Si is newly doped by 225 mg. Si is added in the floating crucible, in which 200 g of GaAs is charged.

The distribution coefficient k of Si in GaAs cannot be defined also.

Figure 4:
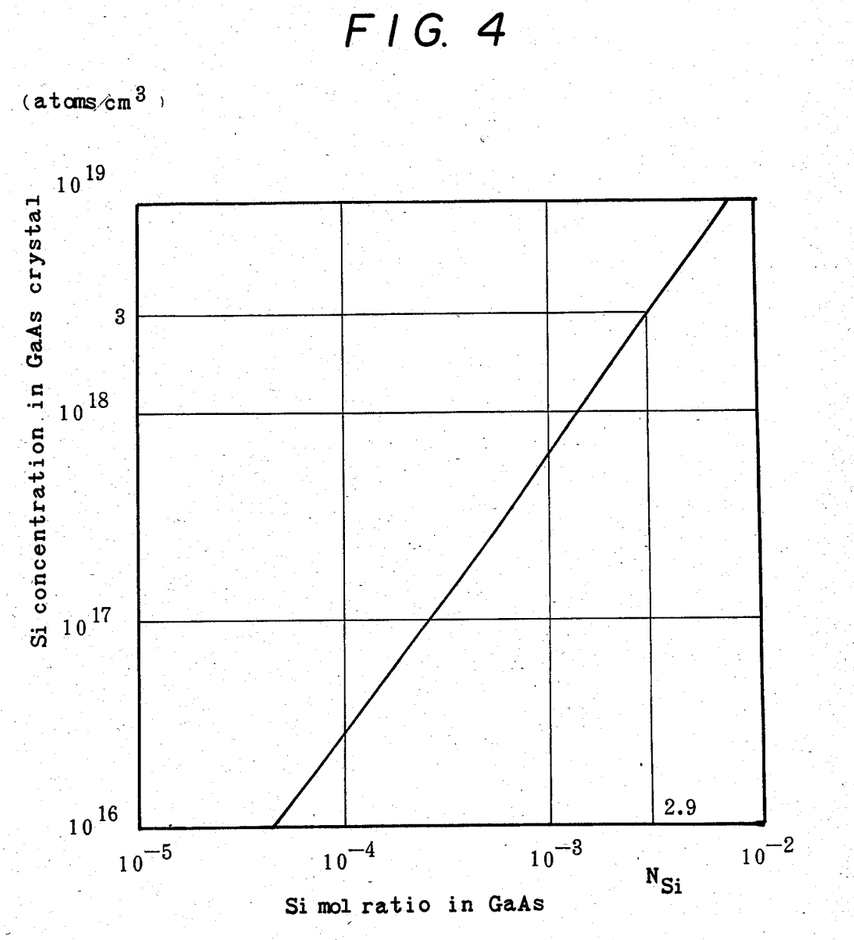
FIG. 4 is a graph showing the relation between the mol ratio of Si in melt and the Si concentration in solidification part in the case of GaAs crystal grown by an LEC method.

FIG. 4 shows the relationship between Si mol ratio in GaAs and Si concentration in a grown crystal.

Si mol ratio is $2.9 \times 10^{-3}$. From FIG. 4, Si concentration in a GaAs host crystal turns out to be $$n(Si) = 3 \times 10^{18} \text{ cm}^{-3}$$

We measured Si concentrations at many parts of the grown crystal. The measured concentration of Si was 3 to $4 \times 10^{18}$ cm$^{-3}$.

We also counted EPD on wafers. The result were;
average EPD at front end = 150 cm$^{-2}$
average EPD at back end = 300 cm$^{-2}$ We calculated concerning the sampling points. $\delta$ satisfied the inequality $$-1\% < \delta < +0.9\%$$

We consider the reason why EPD is less than the former example. The length of a bond Si-As is 2.35 Å. It is slightly shorter than the length of the bond Ga-As (2.44 Å). Then the arithmetic average of bond lengths including newly-doped Si approaches the standard bond length nearer than in the former example. This may raise the lattice coordination.

(f) GENERALIZATION (GaAs; In, B)

GaAs crystals doped with an isoelectronic over-impurity In and under-impurity B will be now considered generally. Bond lengths are;
standard length of GaAs: $a_0 = 2.44$ Å
bond length of G-As: $a_1 = 2.07$ Å
bond length of In-As: $a_2 = 2.62$ Å

The arithmetic average "$\bar{a}$" is given by $$\bar{a} = \frac{2.07 x_1 + 2.62 x_2}{x_1 + x_2} \quad (26)$$

where $x_1$ is a concentration of B and $x_2$ is a concentration of In. The requirements of the invention is simply written as $$0.98 a_0 \leq \bar{a} \leq 1.02 a_0 \quad (27)$$
and
$$x_1 + x_2 \geq 10^{18} \quad (28)$$

Figure 3:
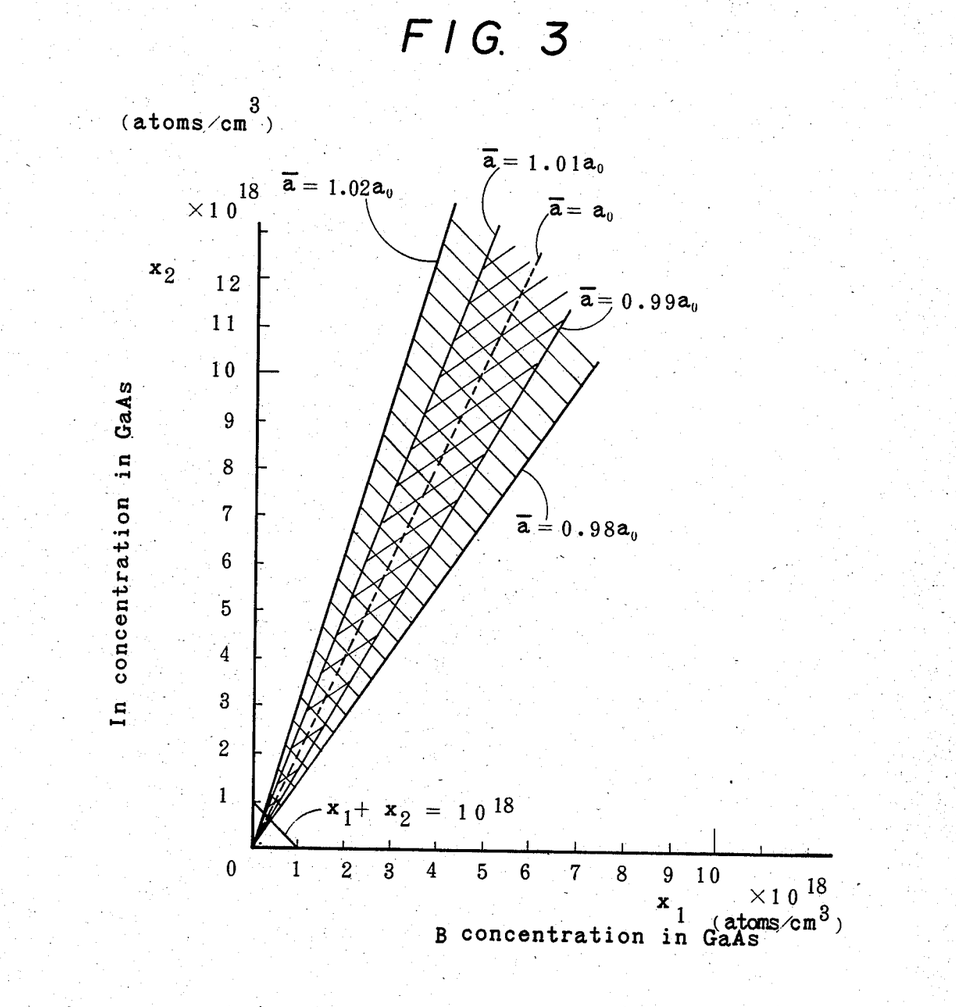
FIG. 3 is a graph showing the preferable region of impurity concentrations satisfying the requirement of the invention, wherein GaAs is the host crystal, and B and In are the impurities to be doped. Abscissa is the B concentration $x_1$, and ordinate is the In concentration $x_2$. The region drawn with parallel slant lines corresponds to $|\delta| \leq 0.02$. The region drawn with double parallel slant lines corresponds to $|\delta| \leq 0.01$.

FIG. 3 shows the region of impurity concentrations allowed by this invention.

The abscissa is the B concentration $x_1$. The ordinate is the In concentration $x_2$. The dotted line shows the relation $\bar{a} = a_0$. The region covered by many parallel slant lines is the region which satisfies the requirement of the invention ($|\delta|$ is less than 0.02). The region covered by double parallel slant lines is the region in which $|\delta|$ is less than 0.01.

Further generalization will be considered.

The requirement of the invention is simply expressed by $$\Sigma x_1 + \Sigma x_2 \geq 10^{18} \quad (29)$$

$$-0.02 \leq \Sigma \eta_1 x_1 + \Sigma \eta_2 x_2 \leq 0.02 \quad (30)$$

where "$x_1$" is a concentration of isoelectronic under-impurity in a grown crystal, "$x_2$" is a concentration of isoelectronic over-impurity, "$\eta_1$" is the deviation of the bond length "$a_1$" from the standard bond length "$a_0$", "$\eta_1$" is the deviation of the bond length "$a_2$" from the standard bond length, and $\Sigma$ signifies to sum up the succeeding value with regard to all isoelectronic under- or over-impurities, if more than one under- or over-impurities are doped.

Especially when an under-impurity and an over-impurity are doped, the best condition ($\delta = 0$) is realized by determining the impurity concentrations by $$(-\eta_1) x_1 = \eta_2 x_2 \quad (31)$$

The advantages of the invention will be explained.

(1) This invention enables us to make a single crystal of compound semiconductors of groups III-V with very low dislocation density by LEC methods or HB methods.

(2) Even if the impurity concentrations of a crystal grown by LEC methods are high, the crystal is single in nearly full length by the double doping of isoelectronic impurities. Impurity inclusion scarcely occurs, because the size effects of the under-impurity and the over-impurity cancel each other. Some isoelectronic impurities have the impurity hardening effect for certain host crystals. However the impurity hardening effect often requires great amount of the impurity doping. Single impurity doping would occur dislocations, impurity inclusion or other lattice defects. However in this invention such lattice defects do not occur, because enough doping of another impurity compensates the size effect of the excess impurity doping for the impurity hardening effect.

(3) This invention defines only the concentrations of isoelectronic impurities. However the single crystal of this invention may be doped with an anisoelectronic impurity to determine the electronic property.

The doping concentration of aniso-electronic impurities should be determined by the desirable specific resistivity of the crystal.

The double dopings of isoelectronic impurities can reduce the dislocation density without any influence over the electronic property.

What is claimed is:

1. Single crystal of compound semi-conductor of groups III-V with low dislocation density, characterized in that the host crystal of compound semiconductor of groups III-V are doped with at least one isoelectronic under-impurity and at least one isoelectronic over-impurity, arithmetic average of bond length "$\bar{a}$" and the standard bond length "$a_0$" between host atoms satisfy the inequality $$-0.02 \leq \frac{\bar{a} - a_0}{a_0} \leq 0.02$$

where the arithmetic average "$\bar{a}$" of bond length is defined by $$\bar{a} = \frac{\Sigma a_1 x_1 + \Sigma a_2 x_2}{\Sigma x_1 + \Sigma x_2}$$

where "$a_1$" is a tetrahedral covalent bond length between the isoelectronic under-impurity and the host atom in a two-component crystal consisting of elements same with the impurity atom and the host atom, "$x_1$" is an impurity concentration of the isoelectronic under-impurity, "$a_2$" is a tetrahedral covalent bond length between the isoelectronic over-impurity and the host atom in a two-component crystal consisting of elements same with the impurity atom and the host atom, "$x_2$" is and impurity concentration of the isoelectronic over-impurity, and $\Sigma$ signifies to sum up the succeeding values with regard to all under- or over-isoelectronic impurities if more than one impurities are doped, and the total concentration of isoelectronic impurity satisfies the inequality $$\Sigma x_1 + \Sigma x_2 \geq 10^8 \text{ atoms/cm}^3.$$

2. Single crystal of compound semi-conductor as claimed in claim 1, wherein the host crystal is GaAs, the isoelectronic under-impurity is B, and the isoelectronic over-impurity is In.

3. Single crystal of compound semi-conductor as claimed in claim 1, wherein an anisoelectronic impurity is doped in the host crystal besides the isoelectronic impurities.

4. Single crystal of compound semi-conductor as claimed in claim 3, wherein the host crystal is GaAs, the isoelectronic under-impurity is B, the isoelectronic over-impurity is In, and the anisoelectronic impurity is Si.

5. Single crystal of compound semi-conductor as claimed in claim 3, wherein the host crystal is InP, the isoelectronic under-impurity is Ga, the isoelectronic over-impurity is As, and the anisoelectronic impurity is S.

6. Single crystal of compound semi-conductor as claimed in claim 3, wherein the host crystal is InP, the isoelectronic under-impurity is Ga, the isoelectronic over-impurity is As and the anisoelectronic impurity is Sn.

7. Single crystal of compound semi-conductor as claimed in claim 3, wherein the host crystal is InP, the isoelectronic under-impurity is Ga, the isoelectronic over-impurity is As, and the anisoelectronic impurity is Fe.

* * * * *